United States Patent
Allen et al.

(10) Patent No.: US 10,573,835 B2
(45) Date of Patent: Feb. 25, 2020

(54) MODULAR ELECTRONICS APPARATUSES AND METHODS

(71) Applicant: Nokia Technologies Oy, Espoo (FI)

(72) Inventors: Mark Allen, Great Cambourne (GB); Yinglin Liu, Cambridge (GB); Markku Rouvala, Helsinki (FI); Surama Malik, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 236 days.

(21) Appl. No.: 15/536,278

(22) PCT Filed: Nov. 23, 2015

(86) PCT No.: PCT/FI2015/050813
§ 371 (c)(1),
(2) Date: Jun. 15, 2017

(87) PCT Pub. No.: WO2016/102747
PCT Pub. Date: Jun. 30, 2016

(65) Prior Publication Data
US 2018/0013082 A1    Jan. 11, 2018

(30) Foreign Application Priority Data

Dec. 22, 2014  (EP) .................................. 14199801

(51) Int. Cl.
*H01L 51/05*  (2006.01)
*H01L 51/00*  (2006.01)
(Continued)

(52) U.S. Cl.
CPC ............ *H01L 51/0537* (2013.01); *C09J 9/02* (2013.01); *C09J 131/04* (2013.01); *C09J 171/02* (2013.01);
(Continued)

(58) Field of Classification Search
None
See application file for complete search history.

(56) References Cited

U.S. PATENT DOCUMENTS 5,495,250 A  *  2/1996  Ghaem ................ G06K 19/027
                                                          342/51
5,578,843 A      11/1996  Garabedian et al.
(Continued)

FOREIGN PATENT DOCUMENTS

EP      2980727 A1      2/2016
JP     57-038418    *   3/1982
(Continued)

OTHER PUBLICATIONS

"Flexible Polymer Lithium-ion Battery", Sound new energy, Retrieved on Jul. 3, 2017, Webpage available at : http://www.soundnewenergy.com/News/EnCp?id=94.
(Continued)

*Primary Examiner* — Maria Laios
(74) *Attorney, Agent, or Firm* — Harrington & Smith

(57) ABSTRACT

An apparatus comprising: a module; a substrate; and electrolyte between the module and the substrate, wherein an electronic component is formed between the module and the substrate and wherein the electrolyte is configured to function as the electrolyte in the electronic component and also as the adhesive to attach the module to the substrate.

20 Claims, 11 Drawing Sheets

Figure 1:
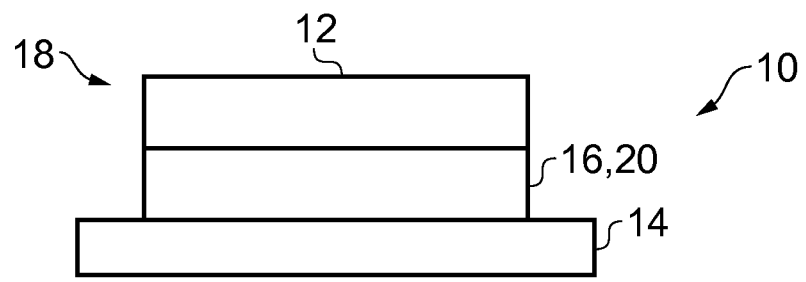

(51) Int. Cl.
| | |
|---|---|
| H01L 27/28 | (2006.01) |
| H01L 27/12 | (2006.01) |
| H01L 51/50 | (2006.01) |
| H01L 29/49 | (2006.01) |
| C09J 9/02 | (2006.01) |
| C09J 131/04 | (2006.01) |
| C09J 171/02 | (2006.01) |
| H01G 11/08 | (2013.01) |
| H01G 11/86 | (2013.01) |
| H01L 23/00 | (2006.01) |
| H01M 10/04 | (2006.01) |
| H01M 10/42 | (2006.01) |
| H01G 11/56 | (2013.01) |

(52) U.S. Cl.
CPC .............. *H01G 11/08* (2013.01); *H01G 11/86* (2013.01); *H01L 24/29* (2013.01); *H01L 27/1259* (2013.01); *H01L 27/283* (2013.01); *H01L 29/4908* (2013.01); *H01L 51/004* (2013.01); *H01L 51/0024* (2013.01); *H01L 51/0034* (2013.01); *H01L 51/508* (2013.01); *H01M 10/04* (2013.01); *H01M 10/425* (2013.01); *H01G 11/56* (2013.01); *H01L 2224/2919* (2013.01); *H01L 2924/063* (2013.01); *H01L 2924/0705* (2013.01); *H01L 2924/07812* (2013.01)

(56) References Cited

U.S. PATENT DOCUMENTS

| | | | |
|---|---|---|---|
| 7,508,014 | B2 | 3/2009 | Tanimoto |
| 7,582,895 | B2 | 9/2009 | Armgarth et al. |
| 7,952,090 | B2 | 5/2011 | Kugler |
| 7,972,930 | B2 | 7/2011 | Jang et al. |
| 8,072,096 | B2 | 12/2011 | Ranganathan et al. |
| 2003/0231106 | A1 | 12/2003 | Shafer |
| 2007/0125419 | A1 | 6/2007 | Gui et al. |
| 2008/0012012 | A1 | 1/2008 | Hara |
| 2008/0135883 | A1 | 6/2008 | Armgarth et al. |
| 2008/0138701 | A1* | 6/2008 | Kuboki .................. H01M 2/08 429/129 |
| 2011/0304305 | A1 | 12/2011 | Rouvala et al. |
| 2012/0212793 | A1 | 8/2012 | Andersson Ersman et al. |
| 2013/0260183 | A1 | 10/2013 | Ellis-Monaghan et al. |
| 2014/0212735 | A1 | 7/2014 | Li et al. |

FOREIGN PATENT DOCUMENTS

| | | |
|---|---|---|
| JP | S61283173 A | 12/1986 |
| JP | H07335779 A | 12/1995 |
| JP | 2010177678 A | 8/2010 |
| JP | 2011151353 A | 8/2011 |
| JP | 2013073856 A | 4/2013 |
| JP | 2013229308 A | 11/2013 |
| WO | 2006/092747 A1 | 9/2006 |
| WO | 2008/015593 A2 | 2/2008 |

OTHER PUBLICATIONS

"PEDOT:PSS or Poly(3,4-ethylenedioxythiophene) Polystyrene Sulfonate", Wikipedia, Retrieved on Jul. 14, 2017, Webpage available at : https://en.wikipedia.org/wiki/PEDOT:PSS.

Zirkl et al., "An All-Printed Ferroelectric Active Matrix Sensor Network Based on Only Five Functional Materials Forming a Touchless Control Interface", Advanced Materials, vol. 23, No. 18, May 10, 2011, pp. 2069-2074.

Kim al., "Electrolyte-Gated Transistors for Organic and Printed Electronics", Advanced Materials, vol. 25, No. 13, Apr. 4, 2013, pp. 1822-1846.

Ersman et al., "Fast-Switching All-Printed Organic Electrochemical Transistors", Organic Electronics, vol. 14, No. 5, May 2013, 14 pages.

Kawahara et al., "Fast-Switching Printed Organic Electrochemical Transistors Including Electronic Vias Through Plastic and Paper Substrates", IEEE Transactions on Electron Devices, vol. 60, No. 6, Jun. 2013, pp. 2052-2056.

"Mobikoma Concept Phone Tablet or Phone—You Decide", Webqeep, Retrieved on Jul. 3, 2017, Webpage available at : http://www.webqeep.com/mobikoma-concept-phone-tablet-or-phone-you-decide/.

Havener et al., "Freeform Fabrication of Organic Electrochemical Transistors", Proceedings of the 18th Solid Freeform Fabrication Symposium, 2007, 14 pages.

Jain et al., "Flexible Electronics and Displays: High-Resolution, Roll-To-Roll, Projection Lithography and Photoablation Processing Technologies for High-Throughput Production", Proceedings of the IEEE, vol. 93, No. 8, Aug. 2005, pp. 1500-1510.

"Advanced Smart Sensor Networks Open Up a Multitude of Applications", Electronic Design, Retrieved on Jul. 14, 2017, Webpage available at : http://www.electronicdesign.com/components/advanced-smart-sensor-networks-open-multitude-applications.

Extended European Search Report for corresponding European Patent Application No. 14199801.3, dated Jul. 9, 2015, 6 pages.

International Search Report and Written Opinion for corresponding Patent Cooperation Treaty Application No. PCT/FI2015/050813, dated Mar. 4, 2014, 10 pages.

Office action for corresponding Korean Patent Application No. 2017-7020330, dated Aug. 27, 2018, 4 pages of office action and no pages of office action translation available.

Notice of Allowance for corresponding Japanese Patent Application No. 2017-533575, dated Aug. 28, 2018, 2 pages of office action and no pages of office action translation available.

\* cited by examiner

MODULAR ELECTRONICS APPARATUSES AND METHODS

RELATED APPLICATION

This application was originally filed as PCT Application No. PCT/FI2015/050813 filed Nov. 23, 2015 which claims priority benefit from EP Patent Application No. 14199801.3 filed Dec. 22, 2014.

TECHNOLOGICAL FIELD

Examples of the present disclosure relate to modular electronics apparatuses and methods. Some examples relate to modular electronics apparatuses and methods in attaching at least one module to a substrate.

BACKGROUND

In electronics, such as flexible and printed electronics, a modular approach may be adopted in which various flexible or rigid components are populated and joined up on a carrier substrate to form an electronic device.

In such an approach the modules require control and power.

BRIEF SUMMARY

According to various, but not necessarily all, examples of the disclosure there is provided an apparatus comprising: a module; a substrate; and electrolyte between the module and the substrate, wherein an electronic component is formed between the module and the substrate and wherein the electrolyte is configured to function as the electrolyte in the electronic component and also as the adhesive to attach the module to the substrate.

According to various, but not necessarily all, examples of the disclosure there is provided a method comprising: providing a substrate; providing electrolyte on the substrate; and positioning a module on the electrolyte wherein an electronic component is formed between the module and the substrate and wherein the electrolyte functions as the electrolyte in the electronic component and also as the adhesive to attach the module to the substrate.

According to various, but not necessarily all, examples of the disclosure there is provided an electronic device comprising an apparatus, the apparatus comprising a module; a substrate; and electrolyte between the module and the substrate, wherein an electronic component is formed between the module and the substrate and wherein the electrolyte is configured to function as the electrolyte in the electronic component and also as the adhesive to attach the module to the substrate.

The electronic device may comprise a plurality of apparatuses as described in the paragraphs above. The electronic components of the plurality of apparatuses may comprise an electrochemical transistor and the apparatuses may be electrically routed such that the modules are electrically in parallel with the respective electrochemical transistors and are short circuited by the respective transistors when the modules are not being addressed.

According to various, but not necessarily all, there is provided an apparatus comprising a module; a substrate; and electrolyte between the module and the substrate, wherein an electronic component is created between the module and the substrate and wherein the electrolyte is configured to function as the electrolyte in the electronic component and also as the adhesive to attach the module to the substrate

BRIEF DESCRIPTION

Figure 2:
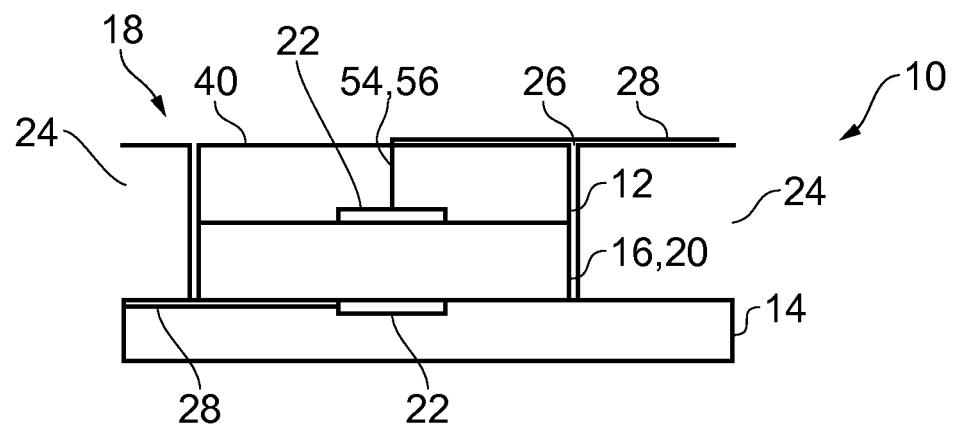
Figure 3:
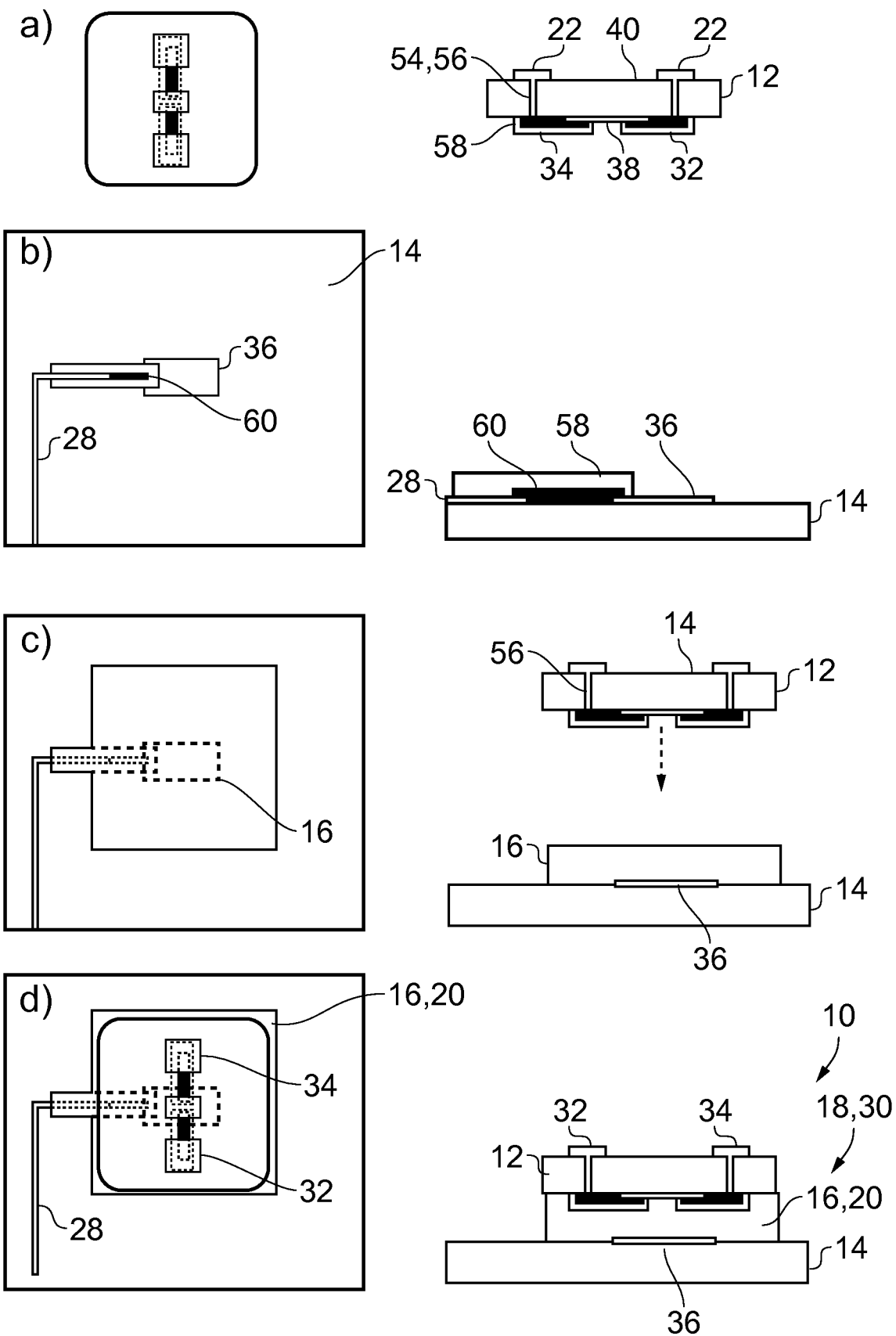
Figure 4:
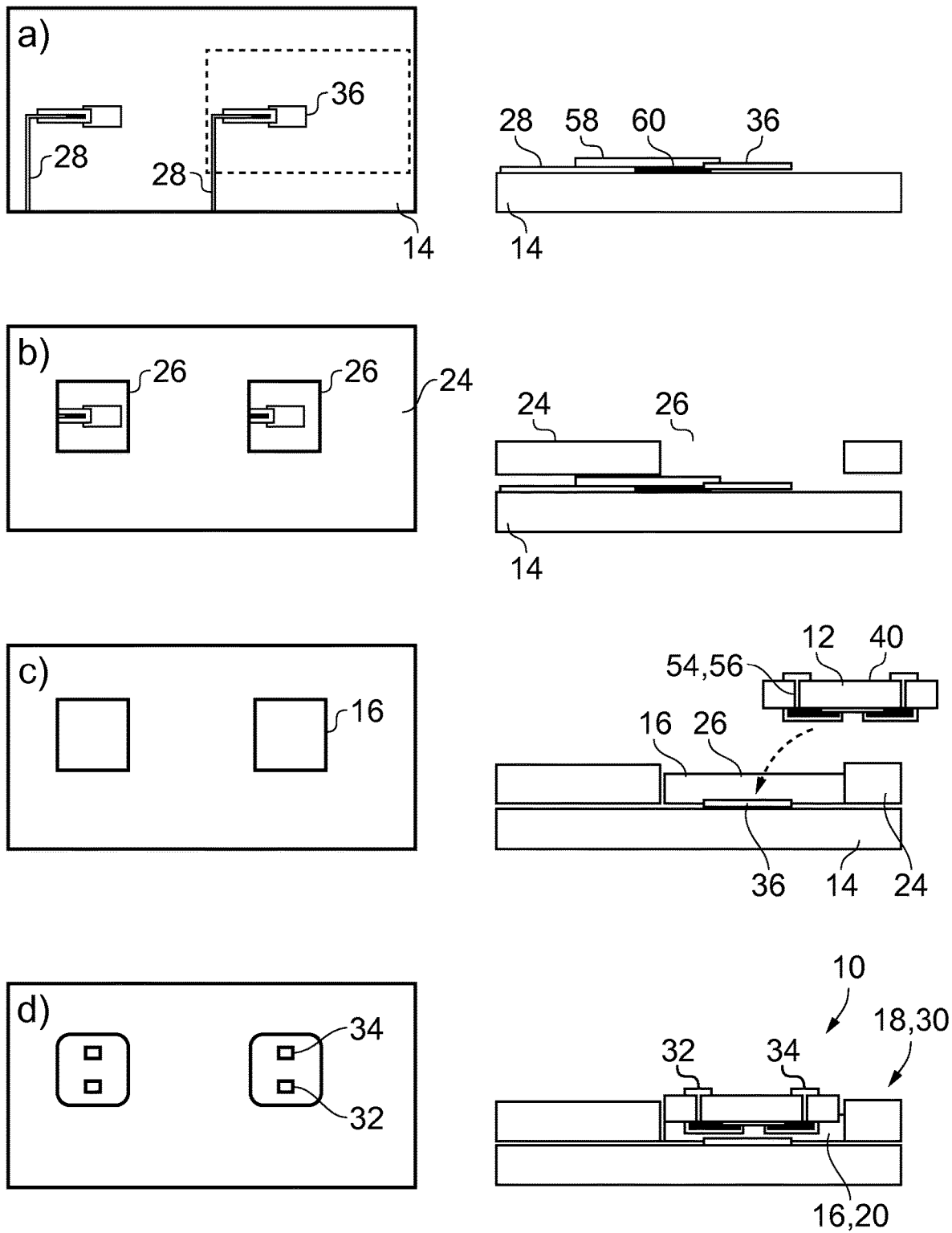
Figure 5:
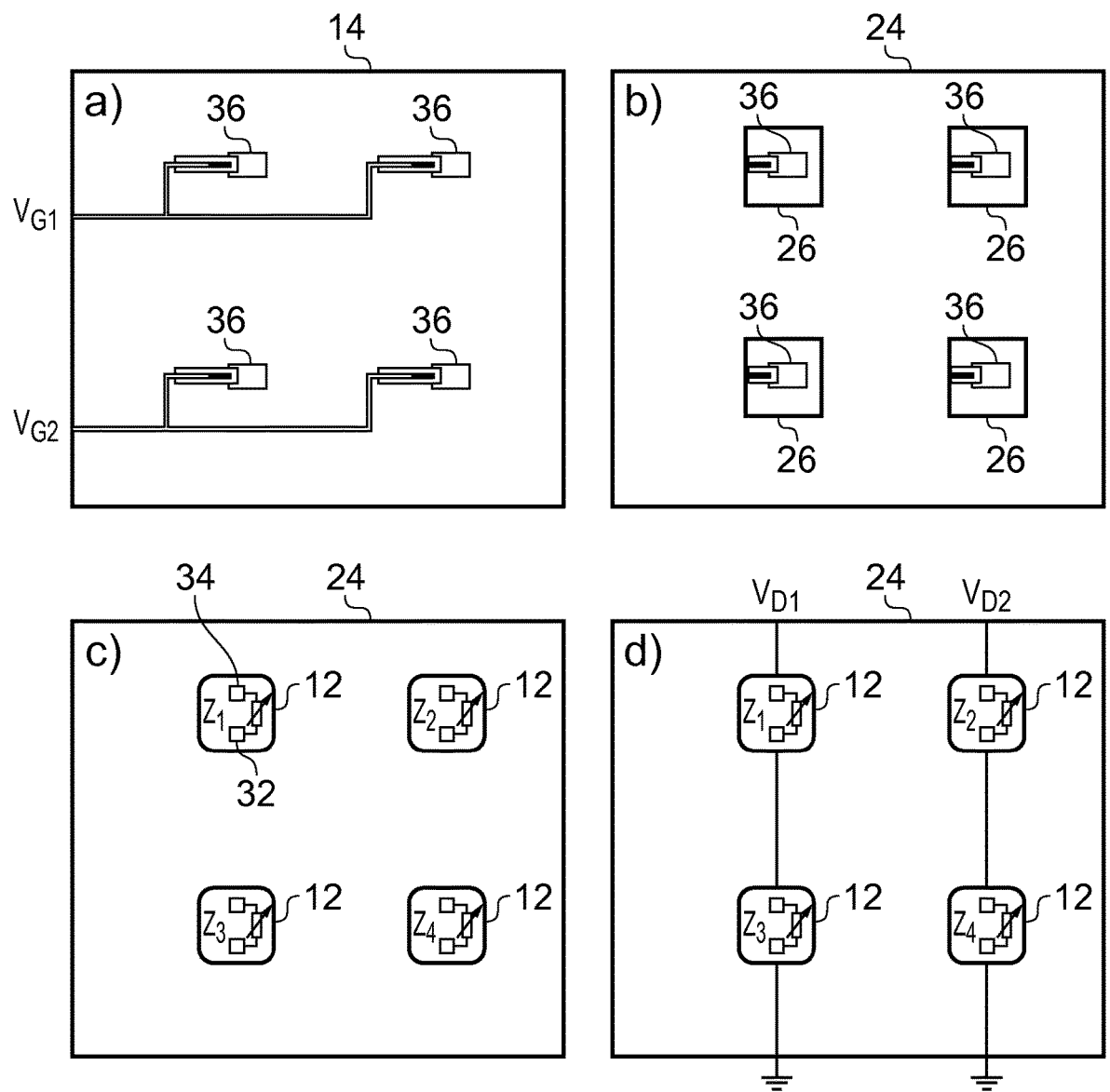
Figure 6:
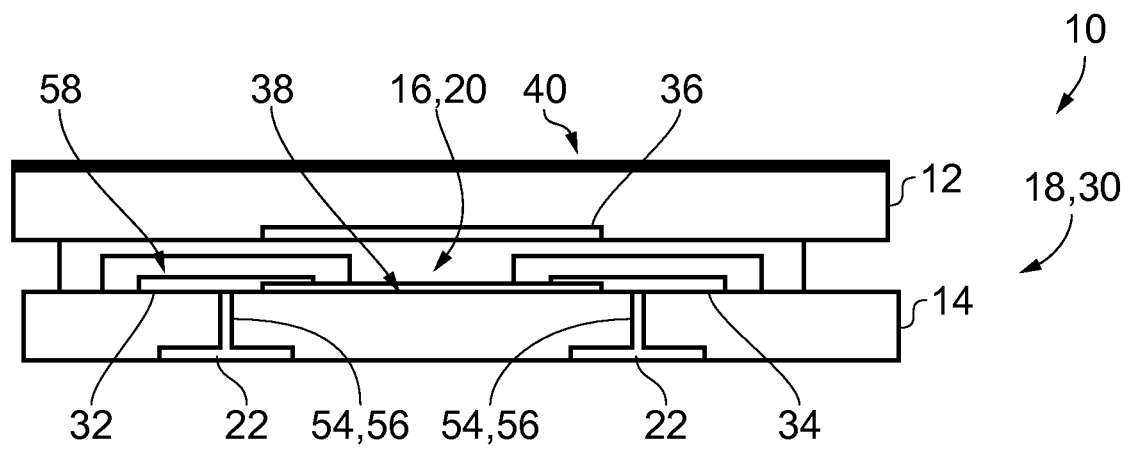
Figure 7:
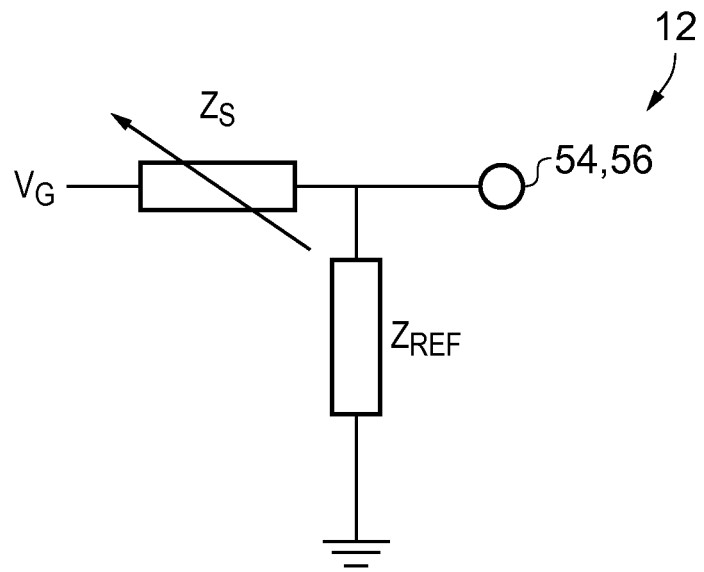
Figure 8:
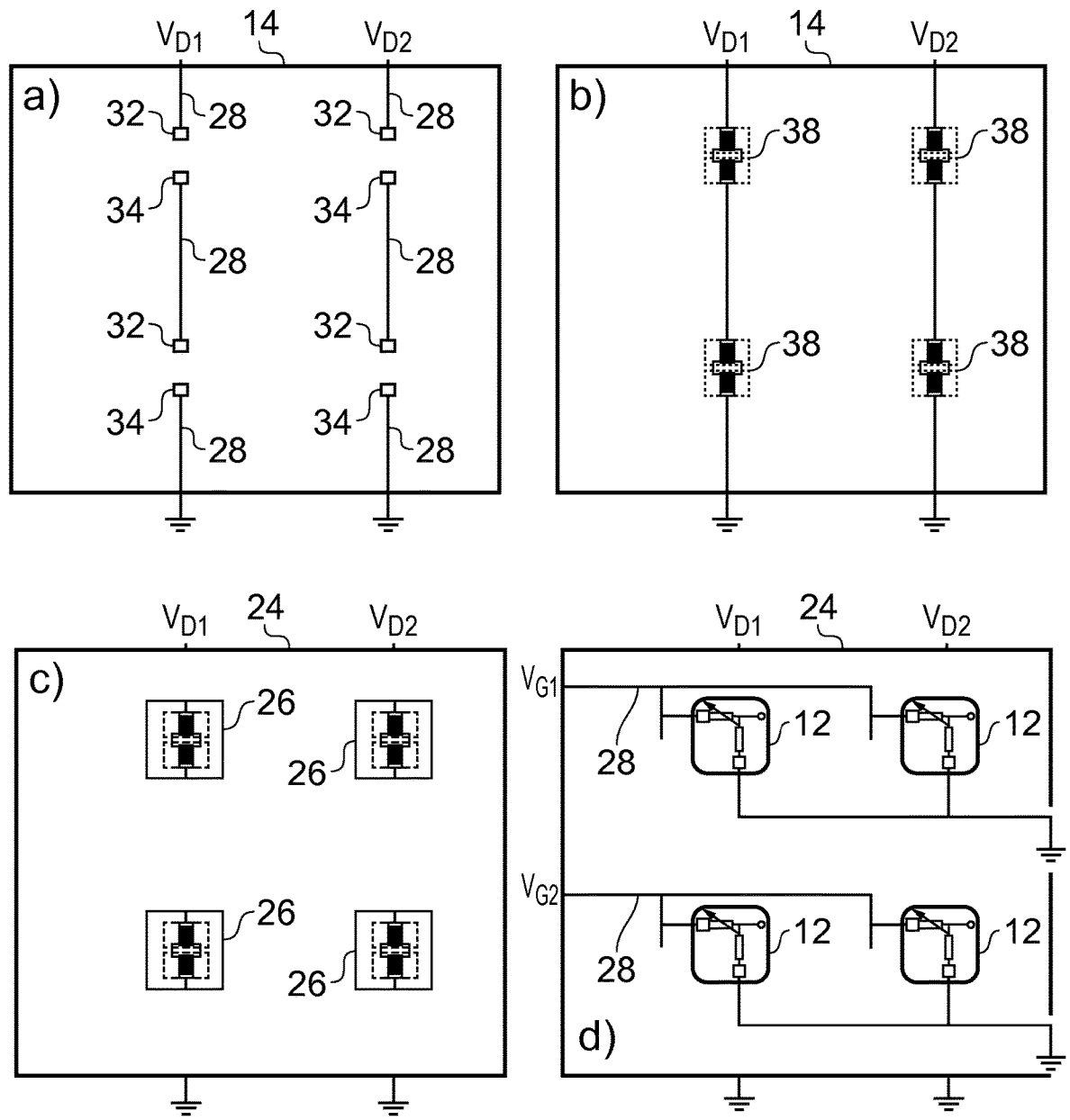
Figure 9:
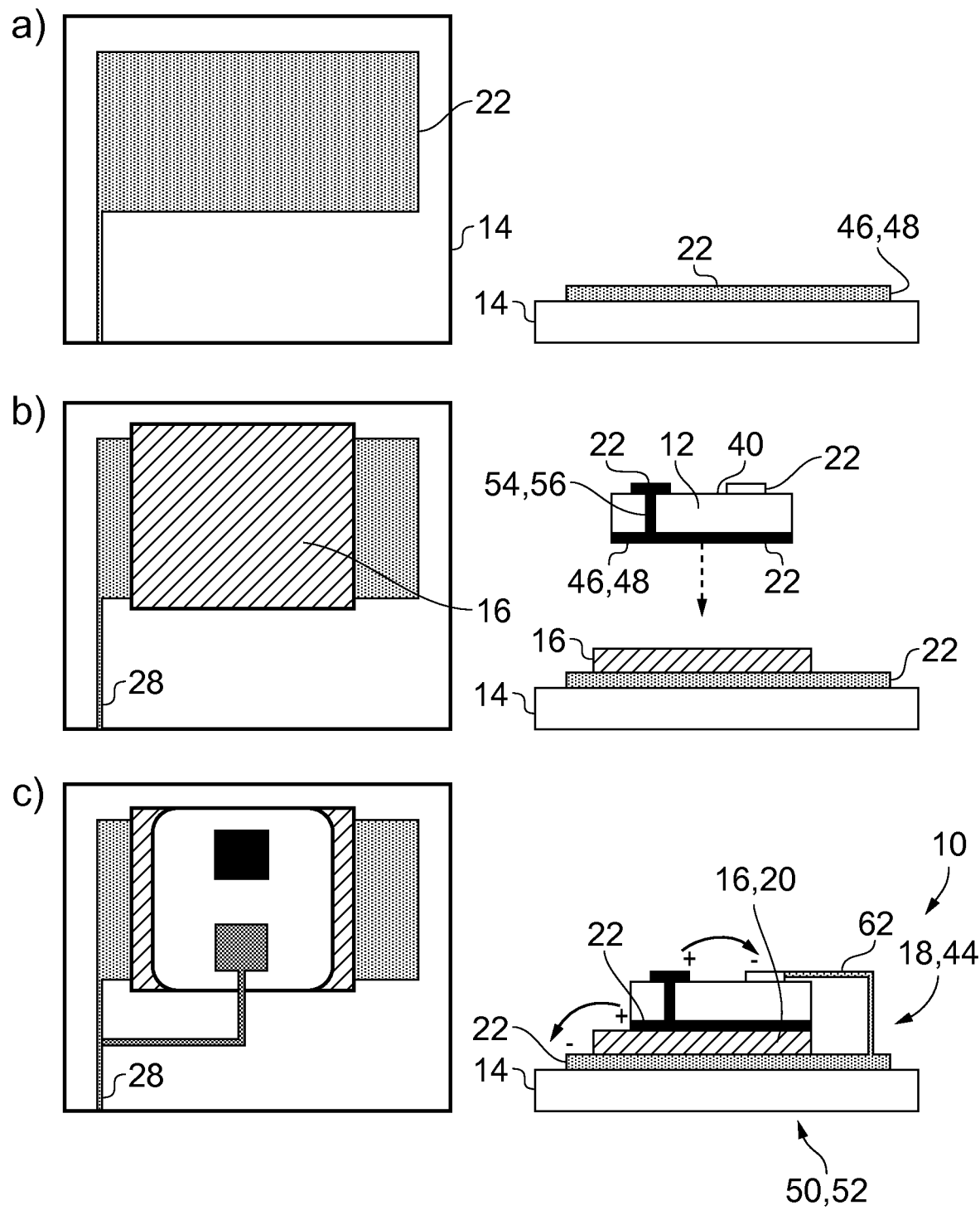
Figure 10:
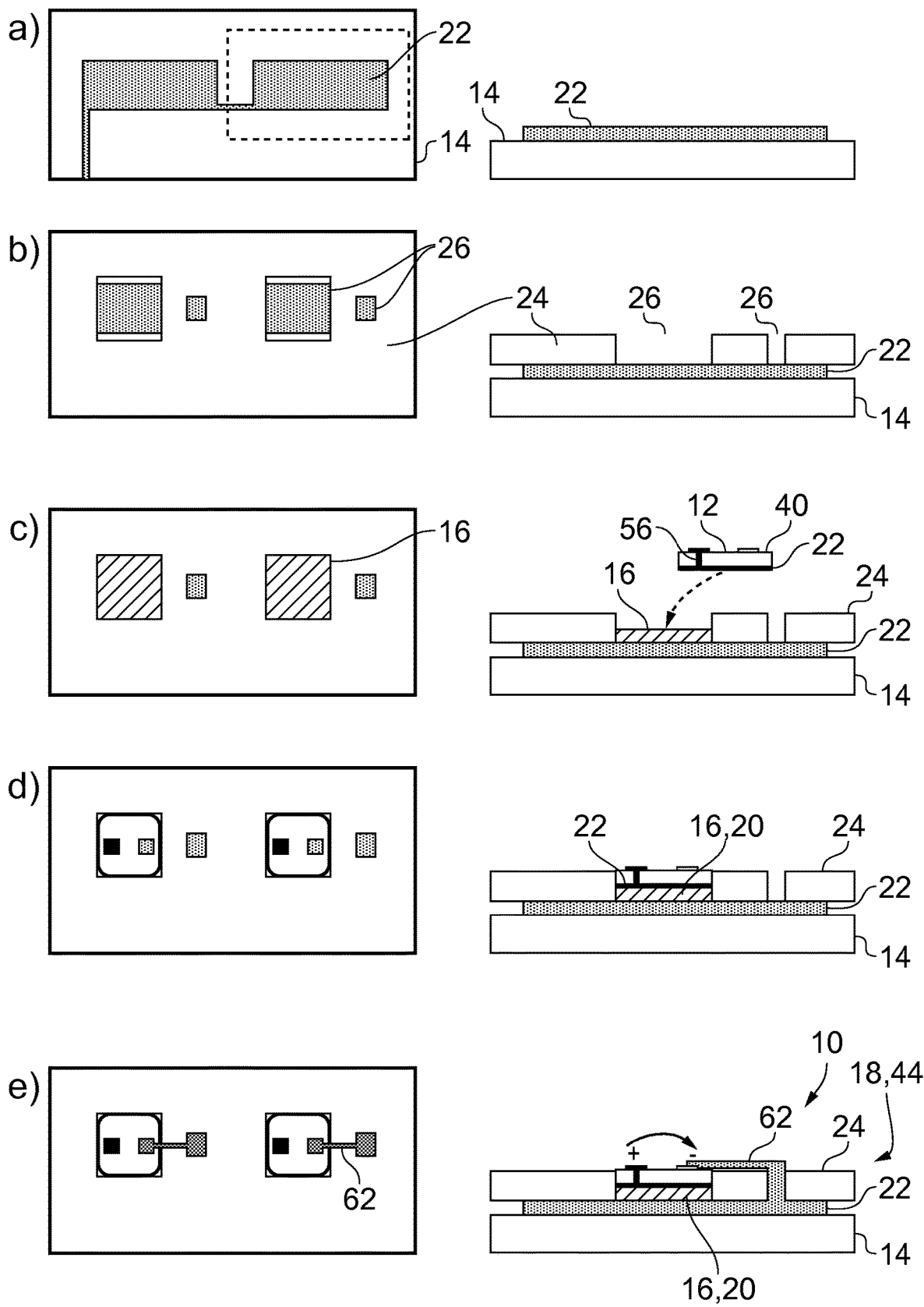
Figure 11A:
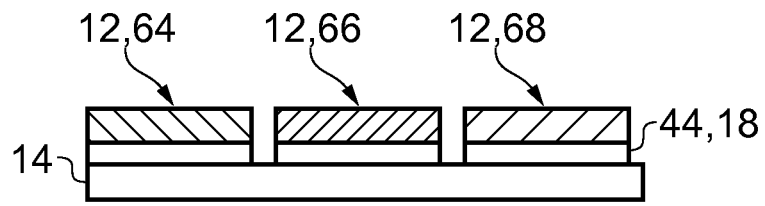
Figure 11B:
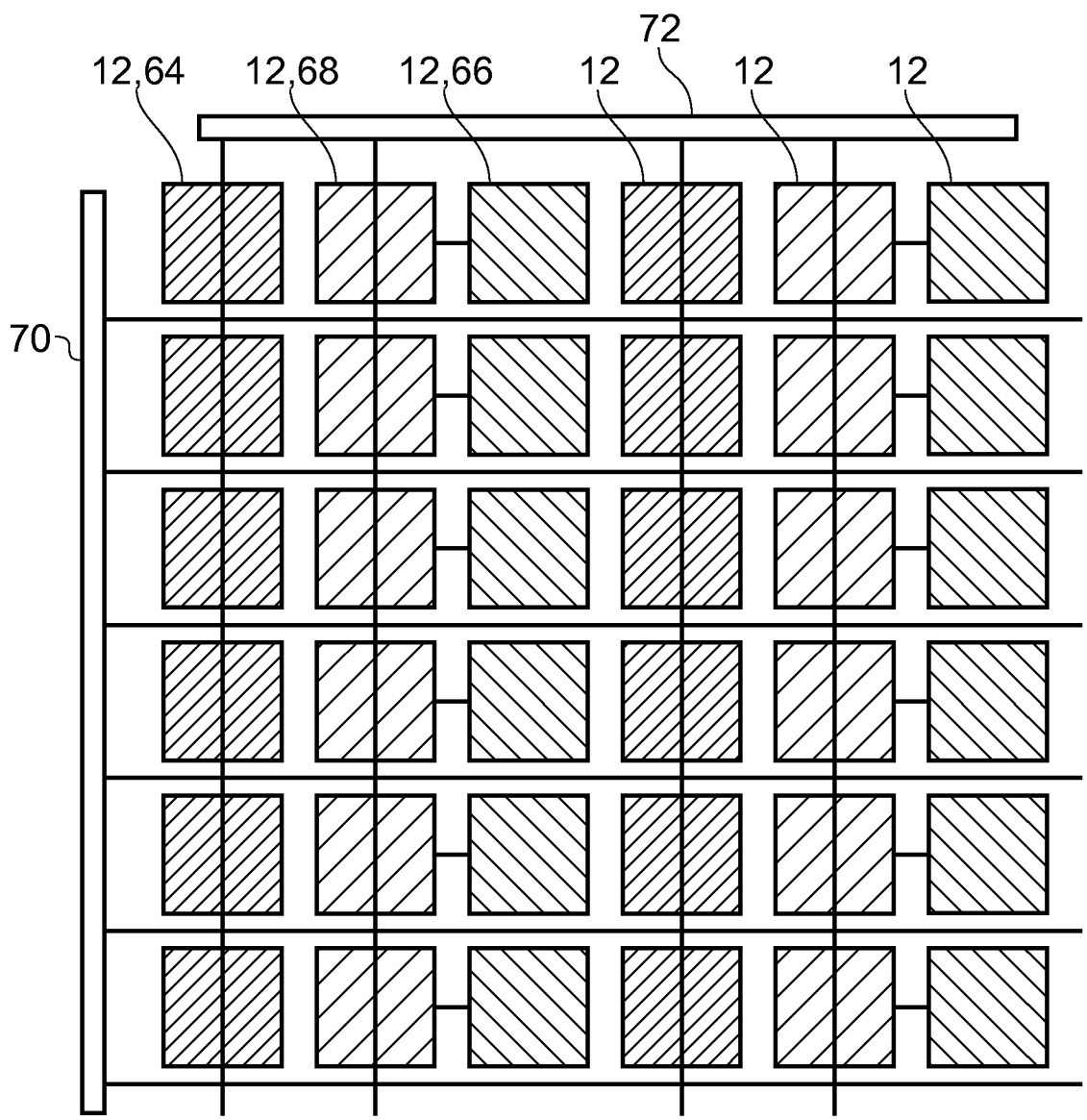
Figure 12:
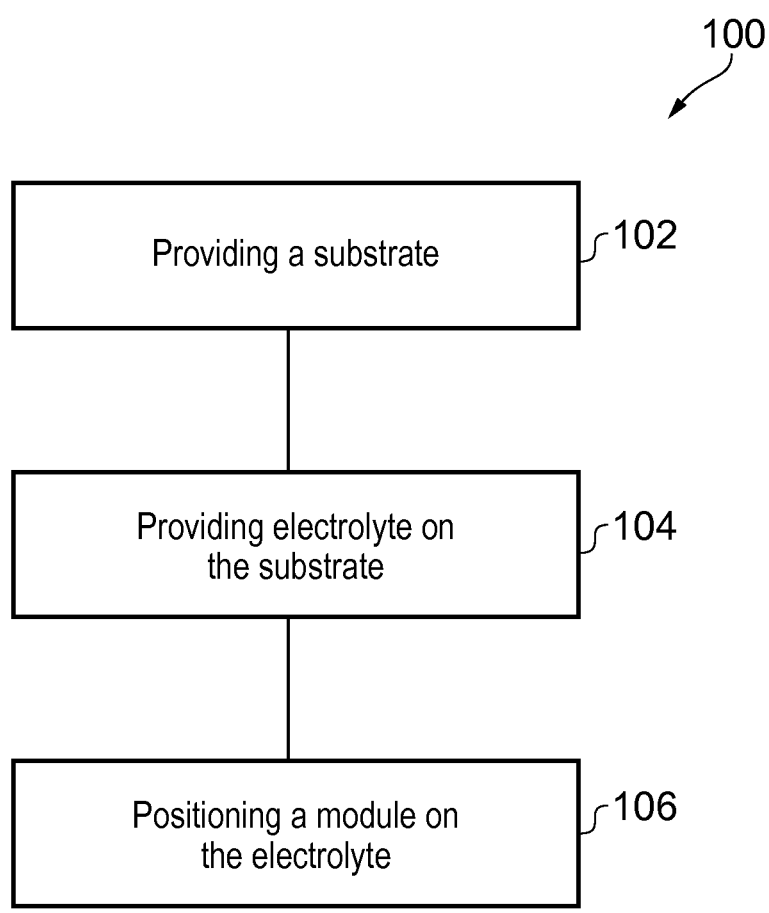
Figure 13:
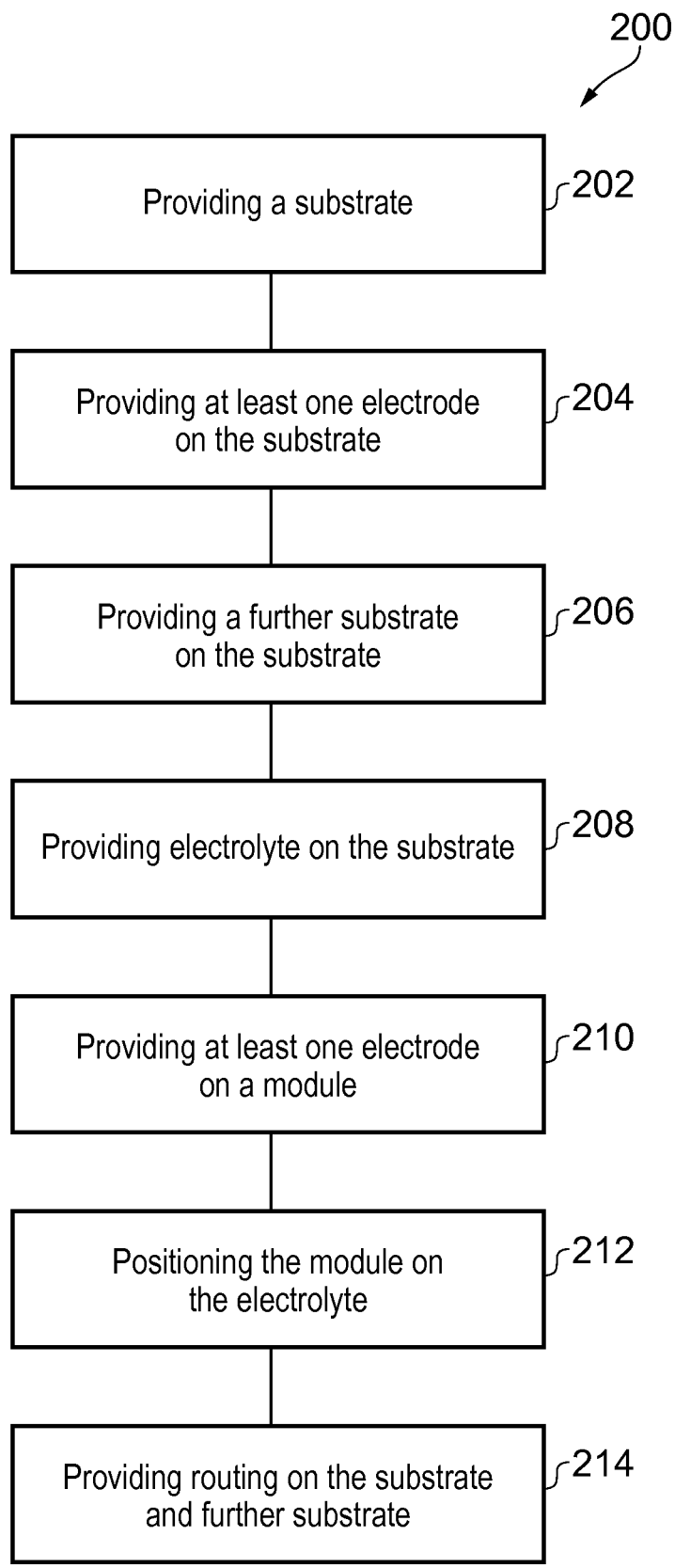

For a better understanding of various examples that are useful for understanding the brief description, reference will now be made by way of example only to the accompanying drawings in which:

FIG. 1 illustrates an example of an apparatus;
FIG. 2 illustrates an example of an apparatus;
FIG. 3 illustrates an example of an apparatus;
FIG. 4 illustrates an example of an apparatus;
FIG. 5 illustrates an example of a layout for routing to address an array of modules;
FIG. 6 illustrates an example of an apparatus;
FIG. 7 illustrates an example layout of a module;
FIG. 8 illustrates and example of a layout for routing to address an array of modules;
FIG. 9 illustrates an example of an apparatus;
FIG. 10 illustrates an example of an apparatus;
FIG. 11A illustrates an example of a plurality of modules attached using electrolyte to a substrate;
FIG. 11B illustrates an example of a device architecture formed as an array of modules;
FIG. 12 illustrates an example of a method; and
FIG. 13 illustrates an example of a method.

DETAILED DESCRIPTION

Examples of the disclosure relate to an electronic component formed between a module and a substrate. In examples, the electronic component comprises electrolyte and the electrolyte functions as the electrolyte in the electronic component and also as the adhesive to attach the module to the substrate.

In examples the electronic component may be any electronic component that comprises electrolyte.

In some examples, a transistor such as an electrochemical transistor may be formed between the module and the substrate. In such examples, the electrolyte may function as the electrolyte in the electrochemical transistor and also as the adhesive to attach the module to the substrate.

In examples, the electrochemical transistor may be used for read out and/or control of circuitry on the module. In some examples electrochemical transistors may be formed as individual modules are attached to the substrate and an active matrix backplane for the modules may therefore be formed as the modules are assembled onto the substrate.

In some examples, an energy storage component such as a supercapacitor or a battery may be formed between the module and the substrate. In such examples, the electrolyte may function as the electrolyte in the energy storage component and also as the adhesive to attach the module to the substrate.

In some examples the energy storage component may supply the corresponding module with power without use of long electrical connections. Additionally or alternatively the energy storage component may be optimized for the corresponding module.

Examples of the disclosure provide the technical effect of forming the electronic component beneath the module when the module is assembled on the substrate. This simplifies the manufacturing procedure.

In addition, the use of the electrolyte as the electrolyte in the electronic component and also as an adhesive also simplifies the manufacturing procedure and decreases the materials involved.

The Figures illustrate an apparatus 10 comprising a module 12, a substrate 14 and electrolyte 16 between the module 12 and the substrate 14, wherein an electronic component 18 is formed between the module 12 and the substrate 14 and wherein the electrolyte 16 is configured to function as the electrolyte 16 in the electronic component 18 and also as the adhesive 20 to attach the module 12 to the substrate 14.

FIG. 12 illustrates a method 100 comprising providing a substrate 14, providing electrolyte 16 on the substrate 14 and positioning a module 12 on the electrolyte 16 wherein an electronic component 18 is formed between the module 12 and the substrate 14 and wherein the electrolyte 16 functions as the electrolyte 16 in the electronic component 18 and also as the adhesive 20 to attach the module 12 to the substrate 14.

FIG. 1 illustrates an example of an apparatus 10. In the illustrated example, the apparatus 10 comprises a module 12, electrolyte 16 and a substrate 14. An electronic component 18 is formed between the module 12, the substrate 14 and comprises the electrolyte 16.

The electrolyte 16 is configured to function as the electrolyte 16 in the electronic component 18 and also as the adhesive 20 to attach the module 12 to the substrate 14.

In examples, the module 12 may be a single component or may be a circuit made up of several components. The module 12 may be rigid or flexible.

The module 12 may comprise any suitable module 12 for use in a flexible or rigid electronic device such as a wearable device, a mobile telephone, a tablet computer, a laptop computer and so on.

In some examples, when the module 12 is assembled onto a substrate 14 and joined up to another module or modules, a functioning electronic device such as those mentioned above may be formed.

The module 12 may comprise/be a module configured to obtain data and/or a module configured to transmit data and/or a module configured to receive data and/or a control module and/or a module configured to process data.

In some examples the module 12 may be considered a module for obtaining data and/or transmitting data and so on.

For example, the module 12 may comprise/be a sensor module and/or a transistor module and/or a signal processing module and/or a memory module and/or a display module and/or a data processing module.

In examples the module 12 may comprise display pixels such as indicator light emitting diodes (LEDs).

The module 12 may be fabricated, in some examples, using standard flexible printed circuit board processes with copper on polyimide.

In the example of FIG. 1 the substrate 14 is configured to function as a carrier substrate for the module 12.

The substrate 14 may be made from any suitable material or materials. In some examples, the substrate may be made from one or more plastics such as polyethylene terephthalate (PET) and so on.

The substrate 14 may be rigid or flexible. In the example of FIG. 1 the substrate is illustrated as being slightly larger than the module 12. However, in examples, the substrate 14 may be larger or smaller than the substrate illustrated in the example of FIG. 1. For example, the substrate 14 may be large enough to allow attachment of a plurality of modules 12 to the substrate 14.

In examples, any number of modules 12 may be attached to the substrate 14.

In the example of FIG. 1, the electrolyte 16 is located between the module 12 and the substrate 14. In some examples, there may be one or more intervening elements between the electrolyte 16 and the module 12 and/or substrate 14. That is, the module 12 may be directly attached to the substrate 14 using the electrolyte 16, and in such examples there are no intervening elements. In other examples the module 12 may be indirectly attached to the substrate 14 and in such examples there are one or more intervening elements at least partially between the module 12 and the electrolyte 16 and/or the electrolyte 16 and the substrate 14.

In examples, intervening elements may comprise one or more electrodes and/or routing and/or electrical contacts and so on. In some examples there may be one or more electrodes 22 on the substrate 14 and/or module 12 (see, for example, FIG. 2).

The electrolyte 16 is configured to function as the electrolyte 16 in the electronic component 18 and also as the adhesive to attach the module 12, directly or indirectly, to the substrate 14.

In examples, the electrolyte 16 may be a gel electrolyte or a solid electrolyte.

As used herein, the terms gel electrolyte and solid electrolyte are intended to mean the state of the electrolyte 16 at room temperature and/or the normal operating temperature of the electronic component 18. For example, the electrolyte 16 may be printed onto the substrate 14 and solidified at room temperature. In some examples the electrolyte 16 may be printed by heating the electrolyte 16 to temperatures up to approximately 150° C. during printing. The electrolyte 16 may then solidify gradually when cooled back down to room temperature.

In some examples, the electrolyte 16 may comprise poly vinyl acetate/phosphoric acid (PVA/$H_3PO4$) and/or poly vinyl acetate/sulfate acid (PVA/$H_2SO_4$) gel electrolyte.

Additionally or alternatively the electrolyte 16 may comprise polyethylene oxide (PEO) doped with a lithium salt (for example LiClO4).

In general, any suitable electrolyte 16 may be used that is configured to function as the electrolyte 16 in the electronic component 18 and also as the adhesive 20 to attach the module 12 to the substrate 14.

In examples the electrolyte may bond the module 12 to the substrate 14 using chemical bonding and so on.

In some examples the module 12 may be placed onto the electrolyte 16 before the electrolyte has solidified to allow the module 12 to be attached to the substrate 14 once the electrolyte 16 has solidified.

The electronic component 18 may comprise any electronic component comprising electrolyte, for example a control component, and/or a storage component. In examples the electronic component may comprise/be an electrochemical transistor 30 (see, for example, FIGS. 3 and 4).

In some examples, the electrochemical transistor 30 may be configured to control circuitry 40 (see FIG. 2) on the module 12 and/or may be configured to be used to read out the circuitry 40 on the module 12.

In examples, an array of modules may be attached to the substrate 14 in this way and, in some examples an active matrix backplane for the module array may be formed directly when the modules 12 are assembled onto the substrate 14 (See FIGS. 5 and 8).

In some examples, the electronic component 18 may comprise/be an energy storage component 44 (see, for example, FIGS. 9 and 10). The energy storage component 44 may be configured to provide power to the module 12, for example to circuitry 40 on module 12.

In examples, the energy storage component 44 may be a supercapacitor 52 or a battery 50 (see FIGS. 9 and 10).

The energy storage component 44 may be optimised for the module 12. For example at least one characteristic of the energy storage component 44 may be optimized for the corresponding module 12. In examples the output voltage and/or power density and/or energy density and/or shape and/or size of the energy storage component 44 may be individualized for the corresponding module 12.

In examples, the apparatus 10 may comprise one or more electrical connections between substrate 14 and module 12.

FIG. 2 illustrates a further example of an apparatus 10. In the example of FIG. 2, the apparatus comprises some elements of the apparatus 10 described in relation to FIG. 1 and comprises additional elements.

In the example of FIG. 2 the apparatus 10 comprises a further substrate 24 on the substrate 14. The further substrate 24 comprises an opening 26. In some examples, the further substrate 24 may comprise a plurality of openings of the same or different sizes. The opening or openings may be cut out openings and so on formed using laser cutting, for example. In some examples the further substrate 24 may be formed on the substrate 14 using wet-coating/patterning methods, for example by printing UV-curable polymer material to form a continuous substrate layer except where the openings are located followed by a UV-curing process action to solidify the polymer layer.

The further substrate 24 may be made of any suitable material. For example, the further substrate may be made from plastic or plastics such as PET and so on. The further apparatus 24 may be provided on the substrate 14 using any suitable method. For example the further substrate may be laminated on to the substrate 14.

In examples the further substrate 24 may be directly or indirectly on the substrate 14 and there may be any number of intervening elements at least partially between the substrate 24 and further substrate 24.

In FIG. 2, the electrolyte 16 and the module 12 are located in the opening 26 of the further substrate 24. For example, the electrolyte 16 may be deposited in the opening 26 and the module 12 placed on top of the electrolyte 16 in the opening 26.

In the example of FIG. 2, the module 12 and electrolyte 16 are illustrated as entirely within the opening 26. In some examples, the electrolyte 16 and module 12 may be located at least partially in the opening 26 of the further substrate 24. For example, some of the module and/or electrolyte 16 may protrude above the surface of the further substrate 24.

In FIG. 2, the substrate 14 comprises an electrode 22 and the module 12 comprises an electrode 22.

The electrodes 22 may be made from any suitable material/materials. For example, the electrodes 22 may be made from any suitable conducting material such as silver or copper coated with conductive carbon and so on. In examples the electrodes 22 may be provided using any suitable method/methods. For example, the electrodes 22 may be formed by printing or coating methods.

In the example of FIG. 2 the electrodes 22 are connected to routing 28 on the substrate 14 and further substrate 28. The electrode 22 on the substrate 14 is connected to the routing 28 on the first substrate 14 and the electrode 22 on the module 12 is connected to the routing 28 on the further substrate 24. The routing 28 illustrated in FIG. 2 is for the electronic component 18.

In examples, the routing may comprise any suitable material/materials and may be provided using any suitable method. For example, the routing may comprise any suitable conductive material such as printed silver.

In some examples, the substrate 14 and/or the module 12 may comprise a plurality of electrodes 22.

For example, in examples where the electronic component 18 is/comprises an electrochemical transistor 30, the source and drain electrodes of the electrochemical transistor 18 may be located on the module 12 and the gate electrode of the electrochemical transistor 30 may be located on the substrate 14. In other examples, the gate electrode of the electrochemical transistor 30 may be located on the module 12 and the source and drain electrodes of the electrochemical transistor 30 may be located on the substrate 14.

The module 12 comprises circuitry 40 configured to provide the functionality of the module 12. For example, the module 12 may comprise sensor circuitry and/or data processing circuitry and so on.

In some examples, the electrochemical transistor 18 may be configured to control the circuitry 40 and/or read out the circuitry 40 of the module 12. For example the electrochemical transistor 30 may be coupled in parallel with the circuitry 40 on the module 12.

In some examples, the circuitry 40 of the module 12 may be configured to control the gate voltage of the electrochemical transistor 30.

In examples where the electronic component 18 is/comprises an energy storage component 44, such as a battery 50 or supercapacitor 52, the module 12 may comprise at least one of the anode 46 or cathode 48 of the energy storage component 44 and the substrate 14 may comprise the counter electrode.

FIG. 3 illustrates an example of an apparatus 10. The apparatus 10 may the apparatus 10 of FIG. 1 or 2.

FIG. 3 also illustrates an example of assembly of a module 12 onto a substrate 14 to form an electrochemical transistor 30 between the module 12 and the substrate 14.

The example of FIG. 3 comprises four parts. These have been labelled a-d in FIG. 3. The left column of FIG. 3 illustrates an overhead view and the right column a cross sectional view.

Part a of FIG. 3, illustrates an example of a module 12. In the illustrated example, the underside of the module 12 comprises a source electrode 32 and a drain electrode 34. In examples, the drain and source electrodes 34, 32 may be formed using any suitable method and may comprise any suitable material/materials. For example, the drain and source electrodes 34, 32 may be formed by patterning conductive carbon and so on.

The module 12 illustrated in FIG. 3 also comprises a channel 38 in contact with the source electrode 32 and drain electrode 34.

The channel 38 may be formed using any suitable method and may comprise any suitable material/materials. For example, the channel 38 may comprise PEDOT:PSS.

The module 12 in the example of FIG. 3 also comprises contact electrodes 22 on the upper surface of the module 12. One of the contact electrodes 22 is connected to the source electrode 32 and the other to the drain electrode 34.

The contact electrodes are connected to the respective source and drain electrodes 32, 34 using electrical connections 54 which in the illustrated example are vias 56.

In the example of FIG. 3, the module 12 comprises circuitry 40. The circuitry 40 is configured to provide the functionality of the module 12. For example, the circuitry 40 may comprise sensor circuitry and/or transistor circuitry and/or data processing circuitry and/or display circuitry and so on.

In FIG. 3, the source electrode 32 and drain electrode 34 are covered by an insulator 58. Any suitable material may be used for the insulator 58. For example SU-8 polymer dielectric may be used.

The insulator is configured to prevent the source and drain electrodes 32, 34 from being in contact with the electrolyte 16 when the module 12 is positioned upon the electrolyte 16 to form the electrochemical transistor 30.

Part b of FIG. 3 illustrates an example of the substrate 14 which in this example is the target substrate for the module 12 illustrated in part a of FIG. 3. Substrate 14 may be as described above in relation to FIGS. 1 and 2.

The substrate 14 comprises a gate electrode 36. The gate electrode 36 is on the upper surface of the substrate 14 and may be formed by any suitable method using any suitable material/materials. For example, gate electrode may be formed from PEDOT:PSS.

In part b of the example of FIG. 3, the substrate 14 comprises routing 28 connected to the gate electrode 36. In the illustrated example the routing 28 is printed silver but any suitable routing 28 may be used.

In the example of FIG. 3, the routing 28 is connected to the gate electrode 36 using a contact 60. The contact 60 may be formed from any suitable material/materials using any suitable method. In the example of FIG. 3, the contact 60 is formed from conductive carbon.

The substrate 14 also comprises an insulator 58 covering the contact 60 and routing 28. The insulator 58 may be any suitable material/materials as described above with regard to the insulator of the source/drain electrodes 32, 34 in part a of FIG. 3.

The insulator 58 is configured to prevent the contact 60 and routing 28 from being in contact with the electrolyte 16 when the electrolyte 16 is provided on the substrate 14.

In part c of the example of FIG. 3 electrolyte 16 has been provided on the substrate 14. The electrolyte 16 may be any suitable electrolyte as described above in relation to FIGS. 1 and 2. The electrolyte 16 may be applied to the substrate 14 using any suitable method. For example, the electrolyte may be deposited over the substrate 14, including the gate electrode 36, by printing.

In part c of the examples of FIG. 3 the gate electrode 36 is illustrated in the cross section, however, the routing 28, insulator 58 and contact 60 are not illustrated for the sake of clarity.

In the example of part c of FIG. 3 the module 12 is shown being positioned upon the electrolyte 16 on the substrate 14. The module 12 may be positioned on the electrolyte 16 using any suitable method. For example, the module 12 may be picked and placed upon the electrolyte 16.

The electrochemical transistor 30 is formed when the module 12 is placed onto the electrolyte 16 and aligned over the gate electrode 36 as illustrated in the example of part d of FIG. 3.

Part d of FIG. 3 therefore illustrates an example of the apparatus 10 illustrated in FIGS. 1 and 2 when the electronic component 18 is an electrochemical transistor 30.

As in part c of the example of FIG. 3, in part d the gate electrode 36 is illustrated on the substrate 14 in the cross section but the other components on the substrate 14 are not shown in the cross section for the sake of clarity.

In the example of FIG. 3 the electrolyte 16 is configured to function as the electrolyte 16 for the electronic component 18, which is an electrochemical transistor 30, and also as the adhesive 20 to attach the module 12 to the substrate 14.

FIG. 4 illustrates a further example of an apparatus 10. FIG. 4 also illustrates a further example of assembly of a module 12 on to a substrate 14, where an electrochemical transistor 30 is formed between the module 12 and the substrate 14.

In the example of FIG. 4 the overhead view illustrated in the left column shows two gate electrodes 36 and associated routing 28, contact 60 and insulator 58.

However, the right column of FIG. 4 illustrates only one of the gate electrodes 36 as shown by the dashed line in the overhead view of part a of FIG. 4.

Part a in the example of FIG. 4 is similar to part b in the example of FIG. 3. Illustrated in part a of FIG. 4 is a substrate 14 comprising a gate electrode 36 routing 28, a contact 60 and insulator 58.

However, in the example illustrated in FIG. 4 a further substrate 24 is provided on the substrate 14. As illustrated in part b of FIG. 4 the further substrate 24 is provided on top of the elements on the substrate 14.

The further substrate 24 may be made of any suitable material/materials and may be provided on the substrate 14 using any suitable method. For example, the further substrate may be laminated onto the substrate 14. In examples the further substrate 24 may be as described above with reference to FIG. 2.

The further substrate 24 in the example of FIG. 4 comprises a plurality of openings 26. The openings 26 are located above the gate electrodes 36. The openings 26 may be formed in the further substrate 24 using any suitable method. For example, the openings may be cut out openings and so on formed using laser cutting, for example. In some examples the further substrate 24 may be formed on the substrate 14 using wet-coating/patterning methods, for example by printing UV-curable polymer material to form a continuous substrate layer except where the openings are located followed by a UV-curing process action to solidify the polymer layer.

In part c of the example of FIG. 4 the electrolyte 16 has been provided in the openings of the further substrate 24. This is illustrated in the overhead view by the squares in part c of FIG. 4.

As with the example of FIG. 3, in the cross section of part c of FIG. 4 the routing 28 and so on have been omitted for the sake of clarity.

In part c of the example of FIG. 4 a module 12 is illustrated being positioned on the electrolyte 16 in the opening 26 of the further substrate 24.

The module 12 may be as described above in relation to FIGS. 1 to 3. In some examples, the module 12 is the same as the module 12 illustrated FIG. 3.

As illustrated in part d of the example of FIG. 4 the module 12 is positioned on the electrolyte 16 to form the electrochemical transistor 30 between the module 12 and the substrate 14.

In part d of the example of FIG. 4 the source and drain electrodes 32, 34 are indicated at the electrical contacts on the top surface of the module 12. In some examples, routing 28 may be connected to the source and drain electrodes 32, 34 using the electrical contacts 22 on the upper surface of the module 12.

In some examples fewer or more modules may be used than those illustrated in the example of FIG. 4. For example, in some examples a single module 12 may be located in an opening 26 of a further substrate 24. In other examples, a greater number of modules may be located in openings 26 of further substrates 24, for example a number of modules 12 may be connected together in such a manner to provide a functioning electronic device.

In some examples, routing 28 on the substrate 14 may connect the electronic component 18, which is in this example an electrochemical transistor 30, row-wise and routing 28 on the further substrate 24 may connect the electronic component 18 column-wise.

FIG. 5 illustrates an example of a layout for routing to address an array of modules.

In part a of the example of FIG. 5, four gate electrodes 36 and the associated routing 28 and connectors and so on are illustrated. The gate electrodes 36 and so on may be as those described above in relation to FIGS. 3 and 4.

In part a of the example of FIG. 5 the gate electrodes are interconnected row-wise as illustrated by the $V_{G1}$ and the $V_G$ which represent the gate voltages that may be applied to the gate electrodes 36. The gate electrodes 36 are connected using routing 28 on the substrate 14.

At part b of the example of FIG. 5 a further substrate 24 is provided on the substrate 14. This may be as described above in relation to FIG. 4. Four openings 26 are left above the gate electrodes 36 as an example of FIG. 4.

At part c of the example of FIG. 5 four modules 12 are positioned in the openings 26.

In the example of FIG. 5 the modules 12 are sensor modules, however in other examples any suitable type of module 12 may be used.

In FIG. 5 the modules 12 have electrodes 22 on the upper surface connected to the source and drain electrodes 32, 34 (see FIG. 4).

In the example of FIG. 5 the sensor modules 12 have variable impedance, denoted as Z1, Z2, Z3 and Z4. In the example, the sensor circuitry is located on the upper surface of the modules 12 and is electrically connected between the electrodes 22 on the upper surface of the modules 12 for the drain electrode 34 and source electrode 32.

An electrochemical transistor is formed between the substrate 14 and the modules 12.

As illustrated in part d of the example of FIG. 5 the sensor modules 12 are electronically connected in series column-wise using routing on the further substrate 24.

The sensor modules of part d of the example of FIG. 5 are therefore electrically connected in parallel with the electrochemical transistor 30 formed between the substrate 14 and the modules 12.

In the example of FIG. 5, when no gate voltage is applied the electrochemical transistors are in the conducting on state and therefore the sensor modules 12 are short circuited.

In order to take a measurement from a sensor module 12 a gate voltage, for example $V_{G1}$ or $V_{G2}$, is applied to the required gate row causing the electrochemical transistors 30 in that row to be in the non-conducting off state. The corresponding sensor modules of the row having the gate voltage applied will no longer be short circuited.

The impedance of the selected column may then be measured. As the other sensors in that column will remain short circuited due to their corresponding electrochemical transistors 30 being in the conducting on state a measurement of the required module 12 may be taken.

For example, with reference to the example of FIG. 5, if a measurement of the module 12 having impedance marked as Z1 was to be taken, a gate voltage $V_{G1}$ may be applied to the upper row of gate electrodes. This would place the electrochemical transistors 30 corresponding to sensors having impedance Z1 and Z2 in FIG. 5 into the non-conducting off state.

The impedance of the column marked $V_{D1}$ could then be measured to take a reading of the impedance Z1. The module having impedance Z3 would remain short circuited in this example as no gate voltage $V_{G2}$ is being applied.

A layout such as the one illustrated in the example of FIG. 5 provides a technical benefit as the modules 12 are connected without the use of crossovers and therefore a simplified fabrication process is provided.

A modular array formed with an active matrix backplane according to examples of the disclosure may be assembled fully by scalable printing processes.

Electrochemical transistors, as used in examples of the disclosure, can be switched at low voltages (approximately 1.5 V) and therefore a backplane as in examples of the disclosure is compatible with flexible power sources such as a printed battery. FIG. 6 illustrates a further example of an apparatus 10. In some examples, the apparatus 10 of FIG. 6 may be as described above in relation to FIGS. 1 and 2.

In the example of FIG. 6, the electronic component 18 formed between the module 12 and the substrate 14 is an electrochemical transistor 30.

However, in the example of FIG. 6, the gate electrode 36 is located on the underside of the module 12 and the source and drain electrodes 32, 34 are located on the substrate 14. The channel 38 is also located on the substrate 14 in the example of FIG. 6.

The substrate 14 in example of FIG. 6 may be similar to the substrate 14 illustrated in the example of FIGS. 3 to 5. In FIG. 6 the substrate 14 comprises insulator 58, module 12, substrate 14, circuitry 40, source electrode 32 and drain electrode 34.

In the example of FIG. 6 the source and drain electrodes 32, 34 are connected to electrodes 22 on the underside of the substrate 14 using electrical connections 54 that may be vias 56.

The apparatus 10 illustrated in the example of FIG. 6 is therefore similar to the apparatus illustrated in the examples of FIGS. 3 to 5 however in the example of FIG. 6 the electrodes and other elements on the module 12 and substrate 14 have been swapped.

In the example of FIG. 6 the source electrode 32 and drain electrode 34 are formed on the substrate 14. This may be advantageous as these electrodes may be patterned via lithography processes, for example, to achieve high resolution. Additionally or alternatively the module 12 may be fabricated by printing processes for example.

The apparatus 10 in FIG. 6 comprises electrolyte 16 between the module 12 and substrate 14. The electrolyte 16 may be any suitable electrolyte and may be provided using any suitable method. The electrolyte is configured to function as the electrolyte for the electronic component 18, which in the example of FIG. 6 is an electrochemical transistor 30, and as the adhesive attaching the module 12 to the substrate 14.

The module 12 of FIG. 6 also comprises circuitry 40 configured to provide the functionality of the module 12. The circuitry 40 may be as described above with reference to FIG. 2.

FIG. 7 illustrates an example layout of a module 12. For example, a module 12 as illustrated in the example of FIG. 6. The module 12 may, in some examples, be a sensor module. In other examples the module 12 may be any suitable module 12.

In the example of FIG. 7, a gate voltage $V_G$ is applied across the module 12 and divided over the sensor impedance, illustrated as $Z_S$, and a reference impedance of a resistor, illustrated as $Z_{REF}$.

The voltage potential set by the sensor is coupled to the gate electrode 36 using an electrical connection 54 which may be a via 56. When a module 12 comprising sensor layout illustrated in FIG. 7 is positioned on the electrolyte 16 as, for example, in FIG. 6, the gate electrode 36 will modulate the channel resistance of the electrochemical transistor according to the impedance of the sensor $Z_S$ of the module 12.

In examples, therefore, the module 12, such as a sensor module, may control the voltage applied to the gate electrode 36 of the electrochemical transistor 30.

In other examples, other layouts for modules 12 may be used.

FIG. 8 illustrates an example of a layout for routing to address an array of modules. For example, the layout of the example of FIG. 8 may be used to address modules as illustrated in the examples of FIGS. 6 and 7.

In part a of the example of FIG. 8 source and drain electrodes 32, 34 are provided on a substrate 14. The source and drain electrodes 32, 34 may be applied using any suitable method and may comprise any suitable material/materials. For example, the source and drain electrodes 32, 34 may comprise any suitable conducting material such as conductive carbon.

As illustrated in part a of example of FIG. 8 the source and drain electrodes 32, 34 are connected column-wise to ground. A voltage $V_{D1}/V_{D2}$ may be applied to the column-wise routing.

In part b of the example of FIG. 8 the channel 38 has been provided for each source and drain electrode 32, 34.

Any suitable material/materials may be used for the channel 38 and the channel 38 may be applied using any suitable method. For example, the channel 38 may be patterned onto the substrate 14.

In addition, in part b of the example of FIG. 8 insulator 58 has been applied to the source and drain electrodes as, for example, illustrated in the example of FIG. 6.

At part c of the example of FIG. 8 a further substrate 24 is provided on the substrate 14. The further substrate 24 may comprise any suitable material and may be provided on the substrate 14 using any suitable method. For example, the further substrate may be laminated over the first substrate 14.

Similarly to the example of FIG. 5, at part c of the example of FIG. 8 openings 26 in the further substrate 24 are located above the electrodes and other elements on the substrate 14.

At part d of the example of FIG. 8 electrolyte 16 is provided in the openings 26 and modules 12 positioned on the electrolyte 16 in the openings 26.

In the example of FIG. 8 the modules 12 may be modules as illustrated in the examples of FIGS. 6 and 7 above. In the example of FIG. 8, the modules 12 are sensor modules comprising the layout illustrated in the example of FIG. 7.

At part d of the example of FIG. 8 the modules are connected row-wise. In the illustrated example, the modules 12 in a row are connected to the same ground. A gate voltage $V_{G1}$ or $V_{G2}$ may be applied to the connected row-wise modules.

In order to address a module 12 in the example of FIG. 8 a gate voltage $V_{G1}$ or $V_{G2}$ is applied to the row comprising the module 12 to be addressed. The impedance of the column, between $V_{D1}$ and ground or $V_{D2}$ and ground, may then be measured.

In the example of FIG. 8 the row without the gate voltage applied will have zero gate voltage and the corresponding electrochemical transistors 30 will be in the conducting on state. The modules 12 of that row will therefore be short circuited.

Accordingly, when measuring the impedance of the selected column it will correspond to the channel resistance of the selected module 12 which is modulated by the impedance of the sensor in question of the measured module 12.

For example, to take a reading of the upper left module 12 in the example of FIG. 8 a gate voltage $V_{G1}$ may be applied to the upper row which would apply a voltage to the gate electrodes of the transistors 30 in the upper row.

The impedance between $V_{D1}$ and ground could then be measured and would correspond to the impedance of the sensor of the module 12 to be measured.

This is because the lower left module 12 in the same row would have no gate voltage applied and therefore would remain short circuited.

Accordingly, the impedance of the column $V_{D1}$ will correspond to the channel resistance of the module to be measured 12 which corresponds to the impedance of the sensor on the module 12.

In the examples of FIGS. 1 to 8 the electrolyte 16 has two functions. The matrix of the electrolyte acts as a host for the ions, producing a solid ion conducting polymer/salt complex and also acts as an adhesive attaching the module 12 to the substrate 14.

FIG. 9 illustrates an example of an apparatus 10. FIG. 9 also illustrates an example of assembly of a module 12 onto a substrate 14 to form a energy storage component 44 between the module 12 and the substrate 14. The apparatus 10 may be as described above in relation to FIGS. 1 and/or 2.

In the example of FIG. 9, three parts are illustrated. These have been labelled a to c in FIG. 9. In the example of FIG. 9, the left column illustrates an overhead view and the right column a cross sectional view.

Part a in the example of FIG. 9 illustrates a substrate 14. An electrode 22 is provided on the substrate 14. The electrode 22 may comprise any suitable material/materials and may be formed by any suitable method. The electrode 22, in some examples may comprise activated carbon and/or carbon black ink mixed with binder.

The electrode 22 may be patterned on the substrate 14 at the location that the module 12 will be located. In some examples, the electrode 22 may be formed by printing a metallic conductor configured to serve as the current collector and printing electrode inks.

In examples, the current collector may comprise a film of conductive metal such as silver, copper, aluminium or any other suitable material.

The electrode 22 in part a of the example of FIG. 9 may form an anode 46 and/or a cathode 48 of an energy storage component 44.

Part b of the example of FIG. 9 illustrates a module 12. The module 12 may be as illustrated in the examples of FIGS. 1 and/or 2.

In FIG. 9 the module 12 comprises an electrode 22 on the underside of the module 12, the electrode 22 on the module 12 may form the counter electrode to the electrode 22 on the substrate 14.

The electrode 22 of the module 12 may comprise any suitable material/materials and may be formed using any suitable method. The electrode 22 on the module 12 may comprise the same material as the electrode 22 on the substrate 14. In other examples, the electrode 22 on the module 12 may comprise a different material than the electrode 22 on the substrate 14.

In the illustrated example, the electrode 22 on the underside of the module 12 comprises the same material as the electrode 22 on the substrate 14.

In the example of FIG. 9, the module 12 also comprises two electrodes 22 on the upper surface of the module 12.

As illustrated in part b of the example of FIG. 9 an electrical connection 54, such as a via 56, may electrically connect the electrode 22 on the underside of the module 12 to one of the electrodes 22 on the topside of the module 12. In the example of FIG. 9 the left electrode 22 on the topside of the module 12 is electrically connected to the electrode 22 on the underside of the module 12.

In the example of FIG. 9 the electrodes 22 on the substrate 14 and the underside of the module 12 form supercapacitor electrodes. In FIG. 9, the electrode 22 on the underside of the module 12 is coated with electronically functional layers to form a supercapacitor electrode.

The module 12 comprises circuitry 40. The circuitry 40 may be any suitable circuitry configured to provide functionality of the module 12 such as sensor circuitry, data processing circuitry, transistor circuitry and so on.

In part b of the example of FIG. 9 electrolyte 16 is provided on the electrode 22 on the substrate 14.

The electrolyte may be any suitable electrolyte and may be provided using any suitable method. For example, the electrolyte may be as described in relation to FIGS. 1 and/or 2. In examples the electrolyte 16 may comprise polyvinyl acetate/phosphoric acid (PVA/H3PO4) or polyvinyl acetate/sulphate acid (PVA/H$_2$SO$_4$) gel electrolyte.

Part b of the example of FIG. 9 illustrates the module 12 being positioned on the electrolyte 16. The supercapacitor is formed with the module 12 being positioned on the electrolyte 16.

The electrolyte 16 is configured to function as the electrolyte for the electronic component 18, which in this example is an energy storage component 44, and is also configured to function as the adhesive 20 to attach the module 12 to the substrate 14.

In part c of the example of FIG. 9 an interconnect 62 connects the electrode 22 on the right of the top side of the module to the electrode 22 of the substrate 14.

In examples the energy storage component 44 may provide power to the module 12, for example the energy storage component 44 may provide power to the circuitry 40 of the module 12.

In FIG. 9 the illustrated arrows indicate that the voltage generated by the supercapacitor is available across the electrodes 22 on the topside of the module 12. For example, a component placed between the top electrodes 22 of the module 12 in FIG. 9 is coupled in parallel with the supercapacitor and may powered in this way.

In the example of FIG. 9 the electrode 22 is electrically connected using routing 28 which may be provided using any suitable method and may comprise any suitable material/materials.

In other examples, the energy storage component 40 may comprise a battery 50. In such examples, the battery electrodes 22 on the substrate 14 and the underside of the module 12 may be formed using any suitable method. For example the electrodes 22 may be formed by printing a layer of charge collector and then printing the electrodes 22 over the charge collector. The charge collector may be formed from any suitable material/materials. For example, the charge collector may comprise a film of a conductive metal such as silver, copper, aluminium or any other suitable material.

In some examples, the energy storage component may comprise a lithium ion battery. In such examples, the first electrode 22 may comprise LiFeO4 or LiCoO2 and the second electrode may comprise printed graphite.

FIG. 10 illustrates a further example of an apparatus 10. FIG. 10 also illustrates an example of assembly of modules 12 onto a substrate 14.

The example illustrated in FIG. 10 is similar to the example illustrated in FIG. 9. However, the example illustrated in FIG. 10 shows two modules in the overhead view. As in the example of FIG. 4 a single module section is shown in the cross sectional view of FIG. 10 as illustrated by the dashed line in part a of the example of FIG. 10.

FIG. 10 illustrates an example of the assembly of modules 12 onto a carrier substrate to form energy storage components 44 between the substrate 14 and the modules 12. The example of FIG. 10 is similar to the example described above with reference to FIG. 9.

In the example of FIG. 10 at part b a further substrate 24 is provided on the substrate 14.

The further substrate 24 may comprise any suitable material/materials, for example, plastic such as PET. The further substrate 24 may be provided on the substrate 14 using any suitable method. For example, the further substrate may be laminated onto the substrate 14.

The further substrate comprises a plurality of openings 26. The openings may be provided using any suitable method. For example, the openings may be cut out openings and so on formed using laser cutting, for example. In some examples the further substrate 24 may be formed on the substrate 14 using wet-coating/patterning methods, for example by printing UV-curable polymer material to form a continuous substrate layer except where the openings are located followed by a UV-curing process action to solidify the polymer layer.

At part c of the example of FIG. 10 electrolyte 16 is provided in the openings 26 where the module 12 will be located. The electrolyte 16 may be provided using any suitable method, for example, the electrolyte 16 may be printed at room temperature or by heating the electrolyte 16 up to approximately 150° C. during printing.

As illustrated at part c of the example of FIG. 10 the module 12 is positioned on the electrolyte 16 in the larger opening 26. The electrolyte 16 functions as electrolyte 16 of the energy storage component 44 and as the adhesive 20 to attach the module 12 to the substrate 14. For example, placing the module 12 onto the electrolyte 16 before the electrolyte has solidified allows the module 12 to be attached to the substrate 14 once the electrolyte 16 has solidified.

Part d of the example of FIG. 10 illustrates the module 12 in position in the opening 26 on top of the electrolyte 16.

In part e of the example of FIG. 10 an interconnect 62 is provided through a second opening 26 and the further substrate 24 to connect the electrode 22 on the substrate 14 to the electrode 22 on the right on the top side of the module 12. The interconnect 62 may be made of any suitable material/materials and may be provided using any suitable method.

FIG. 11A illustrates an example of a plurality of modules 12 attached using electrolyte 16 to a substrate 14.

In the example of FIG. 11A three modules 12 are illustrated. In other examples fewer or more modules 12 may be included.

In the example of FIG. 11A an electronic component 18 is formed between the modules 12 and the substrate 14. In the illustrated example an energy storage component 44 is formed between each of the modules 12 and the substrate 14.

In the example of FIG. 11A therefore each of the modules 12 may be powered by their own energy source formed between the module 12 and the substrate 14.

In the example of FIG. 11A an optimised energy storage component 44 may be provided for each of the modules 12. For example, the output voltage, and/or power density, and/or energy density, and/or shape and/or size of each energy storage component 44 may be individualised depending upon the energy requirement of each module 12.

In addition, the energy storage components 44 do not require long conductor wiring to connect to modules 12 and therefore there is less resistive losses in transferring power from energy source to module 12 compared to, for example, a shared energy source.

In the example of FIG. 11A three different types of module 12 are illustrated. The different types of module 12 are indicated in the example of FIG. 11A using lines going from top left to bottom right, bottom left to top right and vertical lines. These lines are only for illustrative purposes and are not intended to imply any functional or structural limitation of the modules 12.

In example of FIG. 11A the module indicated with lines from top left to bottom right comprises a sensor module 64. The module 12 indicated with lines bottom left to top right comprises a transistor module 66 and the module 12 indicated with vertical lines comprises a signal processing module 68.

In other examples any combination of different modules and numbers of modules may be used. For example, the modules 12 may be in some examples memory elements, display pixels such as indicator light emitting diodes and/or data processing units and so on.

The design illustrated in the example of FIG. 11A reduces package, size and cost and increase safety and flexibility of a device.

FIG. 11B illustrates an example of a device architecture formed as an array of modules 12.

The example of FIG. 11B comprises the three modules 12 illustrated in the example of FIG. 11A. The modules 12 in the example of FIG. 11B are indicated using the same markings as those illustrated in the example of FIG. 11A.

In the example of FIG. 11B the transistor modules 66 are connected to the signal processing modules 68. A column decoder 72 connects column-wise the columns of sensor modules 64 and signal processing modules 68. In the example of FIG. 11B the column decoder 72 may also comprise a signal multiplexer and/or signal de-multiplexer.

A row decoder 70 connects row-wise the connections from the column decoder 72.

In other examples any suitable device architecture of modules 12 may be used.

FIG. 12 illustrates an example of a method 100.

At block 102, a substrate 14 is provided. The substrate 14 may be made of any suitable material/materials and may be provided using any suitable method.

For example, the substrate 14 may be as described above in relation to FIGS. 1 and/or 2.

At block 104 electrolyte 16 is provided on the substrate 14.

The electrolyte 16 may be any suitable electrolyte 16 and may be provided using any suitable method. For example, the electrolyte 16 may be printed on the substrate 14 and solidified at room temperature. The electrolyte 16 may be printed at elevated temperature up to approximately 150° C.

In examples, the electrolyte 16 may be as described above in relation to FIGS. 1 and/or 2.

In some examples, the electrolyte 16 may not be provided directly on the substrate 14 but may be provided at least partially on one or more elements on the substrate 14.

At block 106 a module 12 is positioned on the electrolyte 16. In examples, an electronic component 18 is formed between the module 12 and the substrate 14 when the module 12 is positioned on the electrolyte 16.

In examples, the module 12 may be as described in relation to FIGS. 1 and/or 2.

The electrolyte 16 functions as the electrolyte 16 in the electronic component 18 and also as the adhesive 20 to attach the module 12 to the substrate 14.

The module 12 may be any suitable module 12. For example, the module 12 may comprise a sensor module and/or a signal processing module and/or a transistor module and/or a display module and so on.

In the examples, positioning a module 12 on the electrolyte 16 may comprise providing one or more connections between the substrate 14 and/or an electrical element, such as routing 28. Additionally or alternatively positioning a module 12 on the electrolyte may comprise providing one or more electrodes 22 on the substrate 14 and/or the module 12.

In examples, the actions of blocks 104 and 106 may be repeated to attach a plurality of modules 12 to the substrate 14 and to form an electronic component 18 between each of the modules 12 and the substrate 14. In examples, the electronic component 18 formed between each of the modules 12 may be different or may be the same.

In examples, the electronic component formed may be a transistor such as an electrochemical transistor 30 or an energy storage component 44 such as a battery 50 or a supercapacitor 52.

FIG. 13 illustrates an example of a further method 200.

At block 202 a substrate 14 is provided. Block 202 may be as block 102 described in relation to FIG. 12.

At block 204 at least one electrode is provided on the substrate 14.

The at least one electrode 22 may be made from any suitable material/materials and may be provided using any suitable method. In examples, the at least one electrode 22 may be as described above in relation to FIG. 2.

In some examples, the at least one electrode 22 may comprise a source electrode 32 and drain electrode 34 for a transistor such as an electrochemical transistor 30.

In some examples, a channel 38 for an electrochemical transistor 30 may also be provided.

In examples, the at least one electrode 22 may comprise a gate electrode 36 for a transistor, such as an electrochemical transistor 30.

In other examples, the at least one electrode may comprise an anode and/or cathode for an energy storage component 44 such as a battery 50 or supercapacitor 52.

At block 206 a further substrate 24 is provided on the substrate 14.

The further substrate 24 may be made of any suitable material/materials and may be provided on the substrate 14 using any suitable method. For example, the further substrate 24 may be as described above in relation to FIG. 2.

In some examples, the further substrate 24 may be laminated on the substrate 14.

The further substrate 24 may comprise one or more openings. In examples, the openings may be cut out openings and may, for example, be located over the at least one electrode provided on the substrate 14.

At block 208 electrolyte 16 is provided on the substrate 14. In examples, block 208 may be as block 104 described in relation to FIG. 12.

In examples, the electrolyte 16 may be provided in at least some of the openings 26 in the further substrate 24 on the substrate 14.

At block 210 at least on electrode 22 is provided on a module 12.

The at least one electrode 22 may be as described above in relation to FIG. 2. The module 12 may be as described above in relation to FIGS. 1 and/or 2.

In some examples, the at least one electrode 22 of the module 12 may comprise a source electrode 32 and drain electrode 34 for a transistor such as an electrochemical transistor 30. In some examples a channel 38 may also be provided on the module 12.

In other examples, the at least one electrode 22 may comprise a gate electrode 36 for an electrochemical transistor 30.

In some examples, the at least one electrode 22 on the module 12 may comprise an anode 46 and/or cathode 48 for an energy storage component 44 such as a battery 50 or a supercapacitor 52.

In examples, the at least one electrode 22 on the module 12 may be the counter electrode/electrodes 22 of the electrode 22 provided on the substrate 14.

For example, if the at least one electrode 22 on the substrate 14 comprises a gate electrode 36 the at least one electrode on the module 12 may comprise a source electrode 32 and drain electrode 34 or vice versa.

If the at least one electrode on the substrate 22 comprises an anode 46 for an energy storage component 44 the at least one electrode 22 on the module 12 may comprise a cathode 48 for the energy storage component 44.

At block 212 the module 12 is positioned on the electrolyte 16.

The module 12 may be positioned on the electrolyte 16 using any suitable method. For example, the module 12 may be pick and placed onto the electrolyte 16.

In examples, the positioning of the module 12 on the electrolyte 16 in the opening 26 may be as described above in relation to FIG. 2.

In examples, the electrolyte 16 functions as the electrolyte 16 for an electronic component 18 formed between the module 12 and the substrate 14 and also as an adhesive 20 to attach the module 12 to the substrate 14.

For example, an electrochemical transistor 30 or energy storage component 44 may be formed by positioning the module 12 on the electrolyte 16.

At block 214 routing on the substrate 14 and further substrate 24 is provided. The routing may be for the electronic component 18 formed between the module 12 and the substrate 14.

In examples, the routing 28 may be as described above in relation to FIG. 2.

In some examples an energy harvesting unit may be included in the apparatus 10.

For example the energy storage component 44 of examples of the disclosure may be charged using a energy harvesting unit such as a photovoltaic. Additionally or alternatively the energy storage component of examples of the disclosure may be charged through wireless charging.

As used in this application, the term 'circuitry' refers to all of the following:

(a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in a server, a cellular network device, or other network device.

The blocks illustrated in the FIGS. 12 and 13] may represent steps in a method and. The illustration of a particular order to the blocks does not necessarily imply that there is a required or preferred order for the blocks and the order and arrangement of the block may be varied. Furthermore, it may be possible for some blocks to be omitted.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term 'example' or 'for example' or 'may' in the text denotes, whether explicitly stated or not, that such features or functions are present in at least the described example, whether described as an example or not, and that they can be, but are not necessarily, present in some of or all other examples. Thus 'example', 'for example' or 'may' refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although examples of the disclosure have been described in the preceding paragraphs with reference to various examples, it should be appreciated that modifications to the examples given can be made without departing from the scope of the invention as claimed. For example the size of the electrodes 22 may be varied.

In some examples the electrode 22 on the underside of the module 12 can be any arbitrary size smaller than the size of the module 12 for example.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a module;
   a substrate; and
   electrolyte between the module and the substrate, wherein an electronic component is formed between the module and the substrate and wherein the electrolyte is configured to function as the electrolyte in the electronic component and also as an adhesive to attach the module to the substrate; and
   a further substrate on the substrate, the further substrate comprising an opening, wherein the electrolyte, the electronic component, and module are located at least partially within the opening of the further substrate.

2. An apparatus as claimed in claim 1, wherein at least one electrode of the electronic component is located on the module and at least one electrode of the electronic component is located on the substrate.

3. An apparatus as claimed in claim 1 wherein the apparatus comprises routing for the electronic component on the substrate and on the further substrate.

4. An apparatus as claimed in claim 1, wherein the electronic component comprises an electrochemical transistor.

5. An apparatus as claimed in claim 4 wherein the source and drain electrodes of the electrochemical transistor are located on the module and the gate electrode of the electrochemical transistor is located on the substrate or the gate electrode of the electrochemical transistor is located on the module and the source and drain electrodes of the electrochemical transistor are located on the substrate.

6. An apparatus as claimed in claim 4 wherein the module comprises circuitry and the electrochemical transistor is configured to control the circuitry on the module and/or is configured to be used to read out the circuitry on the module.

7. An apparatus as claimed in claim 6, wherein the electrochemical transistor is electrically coupled in parallel with the circuitry on the module.

8. An apparatus as claimed in claim 6, wherein the circuitry of the module is configured to control the gate voltage of the electrochemical transistor.

9. An apparatus as claimed in claim 1, wherein the electronic component comprises an energy storage component.

10. An apparatus as claimed in claim 9, wherein the module comprises at least one of the anode or the cathode of the energy storage component and the substrate comprises the counter electrode.

11. An apparatus as claimed in claim 9, wherein the energy storage component is a battery or a supercapacitor.

12. An apparatus as claimed in claim 9, wherein the energy storage component is optimised for the module.

13. A method comprising:
    providing a substrate;
    providing electrolyte on the substrate;
    providing a further substrate on the substrate, the further substrate comprising an opening; and
    positioning a module on the electrolyte wherein an electronic component is formed between the module and the substrate and wherein the electrolyte functions as the electrolyte in the electronic component and also as the adhesive to attach the module to the substrate and wherein the electrolyte, the electronic component, and module are located at least partially within the opening of the further substrate.

14. A method as claimed in claim 13, further comprising providing at least one electrode of the electronic component on the module and providing at least one electrode of the electronic component on the substrate.

15. A method as claimed in claim 13, comprising providing routing for the electronic component on the substrate and on the further substrate.

16. A method as claimed m claim 13, wherein the electronic component comprises an electrochemical transistor.

17. A method as claimed in claim 16, comprising providing source and drain electrodes of the electrochemical transistor on the module and providing a gate electrode of the electrochemical transistor on the substrate; or providing the gate electrode of the electrochemical transistor on the module and providing the source and drain electrodes of the electrochemical transistor on the substrate.

18. A method as claimed in claim 13, wherein the electronic component comprises an energy storage component.

19. A method as claimed in claim 13, comprising providing the module with at least one of the anode or the cathode of the energy storage component and providing the substrate with the counter electrode.

20. A method as claimed in claim 18, wherein the energy storage component is a battery or a supercapacitor.

* * * * *